United States Patent
Imoto

(10) Patent No.: US 6,469,374 B1
(45) Date of Patent: Oct. 22, 2002

(54) SUPERPOSED PRINTED SUBSTRATES AND INSULATING SUBSTRATES HAVING SEMICONDUCTOR ELEMENTS INSIDE

(75) Inventor: Takashi Imoto, Yokohama (JP)

(73) Assignees: Kabushiki Kaisha Toshiba, Kawasaki (JP); Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/648,373

(22) Filed: Aug. 25, 2000

(30) Foreign Application Priority Data

Aug. 26, 1999 (JP) ............................................. 11-239033

(51) Int. Cl.[7] .......................... H01L 23/04; H01L 25/10; H01L 23/40; H01L 23/48; H01L 25/04
(52) U.S. Cl. ......................... 257/686; 257/685; 257/777; 257/723; 257/668; 257/700; 257/701; 257/774; 257/758; 257/692; 257/693; 257/737; 257/738; 257/778
(58) Field of Search ................................ 257/686, 685, 257/723, 700, 701, 777, 758, 774, 778, 734, 737, 738, 692, 693, 668

(56) References Cited

U.S. PATENT DOCUMENTS

| | | | |
|---|---|---|---|
| 5,744,827 A | | 4/1998 | Jeong et al. |
| 6,180,881 B1 | * | 1/2001 | Isaak ........................ 257/686 |
| 6,188,127 B1 | * | 2/2001 | Senba et al. ............... 257/686 |
| 6,239,495 B1 | * | 5/2001 | Sakui et al. ................ 257/777 |
| 6,239,496 B1 | * | 5/2001 | Asada et al. ............... 257/777 |
| 6,274,929 B1 | * | 8/2001 | Leong et al. .............. 257/724 |
| 2001/0054758 A1 | * | 12/2001 | Isaak ........................ 257/686 |

FOREIGN PATENT DOCUMENTS

| | | |
|---|---|---|
| JP | 5-291318 | 11/1993 |
| JP | 8-236694 | 9/1996 |
| JP | 9-219490 | 8/1997 |
| JP | 10-135267 | 5/1998 |
| JP | 10-163414 | 6/1998 |
| JP | 11-145381 | 5/1999 |

* cited by examiner

Primary Examiner—Alexander O. Williams
(74) Attorney, Agent, or Firm—Finnegan, Henderson, Farabow, Garrett & Dunner, L.L.P.

(57) ABSTRACT

A semiconductor device including superposed packages is disclosed, which comprises an superposed structure formed by superposing a plurality of superposed substrates each comprised of a wiring printed substrate loaded with a semiconductor element and a conductive-via provided insulating substrate, wherein the wiring printed substrate has a plurality of contact electrodes formed in a plurality of via holes and a plurality of wiring conductors electrically connected to the contact electrodes, the semiconductor element is electrically connected to wiring conductors provided on the wiring printed substrate, the insulating substrate includes a chip cavity larger than the semiconductor element size for accommodating the semiconductor element loaded on the wiring printed substrate and a plurality of contact electrodes, the conductive-via provided insulating substrate and the wiring printed substrate are superposed in such a manner that the contact electrode in the conductive-via provided insulating substrate and the contact electrode in the wiring printed substrate are electrically connected to each other and such that the semiconductor element loaded on the wiring printed substrate is accommodated in the chip cavity in the conductive-via provided insulating substrate so as to constitute a superposed substrate.

14 Claims, 8 Drawing Sheets

SUPERPOSED PRINTED SUBSTRATES AND INSULATING SUBSTRATES HAVING SEMICONDUCTOR ELEMENTS INSIDE

CROSS-REFERENCE TO RELATED APPLICATIONS

This application is based upon and claims the benefit of priority from the prior Japanese Patent Application No. 11-239033, filed Aug. 26, 1999, the entire contents of which are incorporated herein by reference.

BACKGROUND OF THE INVENTION

The present invention relates to a semiconductor device having a superposed type package and a manufacturing method of the same.

Recently, the semiconductor device is often used in a condition that semiconductor devices are superposed in multiple layers in order to achieve high density mounting thereof. A conventionally used superposed type package has been described in for example, Jpn. Pat. Appln. KOKAI Publication No. 9-219490, Jpn. Pat. Appln. KOKAI Publication No. 10-135267 and Jpn. Pat. Appln. KOKAI Publication No. 10-163414. According to the conventional superposed type packages disclosed in these patent applications, thin small outline package (TSOP), tape carrier package (TCP), ball grid array (BAG) and the like are assembled and after that, a plurality of packages are superposed such that external terminals provided preliminarily on the respective packages match with each other. That is, in case of the conventional superposed type packages, superposing process of the respective assembled packages is added to the assembly process of respective packages. Therefore, the number of the processes is increased corresponding to a number of packages to be superposed. In this process, the number of the processes is increased and production cost and material cost are also increased because spacers to be inserted between the respective superposed packages and the like are used, which is a problem to be solved.

In addition to the above-described problem, there is such a problem that a sufficient reliability cannot be secured in operation because a layer boundary is generated in each package when respective packages are superposed. Further, there is also such a problem that a sufficient reliability cannot be secured in terms of mechanical strength. The reason is that the mechanical strength of superposed packages depends on only the strength of electrical connecting portion and therefore the mechanical strength is low. Alternatively, because in conventional example described in the Jpn. Pat. Appln. KOKAI Publication No. 10-163414, Jpn. Pat. Appln. KOKAI Publication No. 10-135267 and the like, the semiconductor device has a float structure, their mechanical strength is low.

Further, the conventional method is not suitable for manufacturing a thin superposed package suitable for a thin semiconductor chip having a thickness of about 30 to 200 μm for development of a semiconductor device in which high density and thinning of the package have been accelerated so that its application field has been expanded to for example, IC card and portable telephone. Further, the conventional thin package has a problem in terms of adaptability because it is lack of flexibility when it is used as such an elastic medium as IC card.

BRIEF SUMMARY OF THE INVENTION

The present invention has been achieved in view of the above-described problem, and therefore, an object of the invention is to provide a thin semiconductor device using an superposed package having an excellent airproof and elasticity which can be manufactured easily and a manufacturing method therefor.

According to a first aspect of the present invention, there is provided a semiconductor device including a superposed structure formed by superposing a plurality of superposed substrates each comprised of a wiring printed substrate loaded with a semiconductor element and an inner conductive-via provided insulating substrate, wherein the wiring printed substrate has a plurality of contact electrodes formed in a plurality of via holes formed in the wiring printed substrate in such a manner that the contact electrodes are buried in the via holes, and has a plurality of wiring conductors electrically connected to the contact electrodes, the semiconductor element loaded on the wiring printed substrate is electrically connected to the wiring conductors provided on the wiring printed substrate, the conductive-via provided insulating substrate has a chip cavity larger than the semiconductor element size for accommodating the semiconductor element loaded on the wiring printed substrate and a plurality of contact electrodes formed in a plurality of via holes formed in the conductive-via provided insulating substrate in such a manner that the contact holes are buried in the via holes, the conductive-via provided insulating substrate and the wiring printed substrate are superposed in such a manner that the contact electrodes in the conductive-via provided insulating substrate and the contact electrodes in the wiring printed substrate are electrically connected to each other and in such a manner that the semiconductor element loaded on the wiring printed substrate is accommodated in the chip cavity in the conductive-via provided insulating substrate so as to constitute a superposed substrate.

In the semiconductor device according to the first aspect of the present invention, the semiconductor element may be substantially 30 to 200 μm in thickness.

In the semiconductor device according to the first aspect of the present invention, a space for absorbing a stress may be formed between the chip cavity of the inner conductive-via provided insulating substrate of the superposed substrate and the semiconductor element accommodated in the chip cavity. The space may filled with flexible adhesive agent.

In the semiconductor device according to the first aspect of the present invention, the semiconductor device may further comprise a lower, outer conductive-via provided insulating substrate which is superposed on the wiring printed substrate of an lowermost superposed substrate, the outer conductive-via provided insulating substrate having a plurality of contact electrodes formed in a plurality of via holes formed in the outer conductive-via provided insulating substrate in such a manner that the contact electrodes are buried in the via holes, an upper surface of the lower conductive-via provided insulating substrate being in contact with the wiring printed substrate of the lowermost superposed substrate in such a manner that the plurality of contact electrodes of the lower conductive-via provided insulating substrate are electrically connected to the plurality of contact electrodes in the wiring printed substrate of the lowermost superposed substrate and a lower surface of the lower conductive-via provided insulating substrate having a plurality of external terminals connected to the plurality of contact electrodes formed in the plurality of the holes in the lower conductive-via provided insulating substrate. A space for absorbing a stress may be formed between the chip cavity of the inner conductive-via provided insulating substrate of the superposed substrate and the semiconductor element accommodated in the chip cavity. The space may be filled with flexible adhesive agent.

According to a second aspect of the present invention, there is provided a semiconductor device including a superposed structure formed by superposing a plurality of superposed substrates each comprised of a wiring printed substrate loaded with a semiconductor element and an inner conductive-via provided insulating substrate, and including an upper, outer conductive-via provided insulating substrate which is superposed on the inner conductive-via provided insulating substrate of an uppermost superposed substrate and has a plurality of contact electrodes formed in a plurality of via holes formed in the upper conductive-via provided insulating substrate in such a manner that the contact electrodes are buried in the via holes, wherein the wiring printed substrate has a plurality of contact electrodes formed in a plurality of via holes formed in the wiring printed substrate in such a manner that the contact electrodes are buried in the via holes and a plurality of wiring conductors electrically connected to the contact electrodes of the wiring printed substrate, the semiconductor element loaded on the wiring printed substrate is electrically connected to the wiring conductors provided on the wiring printed substrate, the inner conductive-via provided insulating substrate has a chip cavity larger than the semiconductor element size for accommodating the semiconductor element loaded on the wiring printed substrate and a plurality of contact electrodes formed in a plurality of via holes formed in the inner conductive-via provided insulating substrate in such a manner the that contact electrodes are buried in the via holes, the inner conductive-via provided insulating substrate and the wiring printed substrate are superposed in such a manner that the contact electrodes in the conductive-via provided insulating substrate and the contact electrodes in the wiring printed substrate are electrically connected to each other and in such a manner that the semiconductor element loaded on the wiring printed substrate is accommodated in the chip cavity in the conductive-via provided insulating substrate so as to constitute a superposed substrate.

In the semiconductor device according to the second aspect of the present invention, the semiconductor element may be substantially 30 to 200 $\mu$m in thickness.

In the semiconductor device according to the second aspect of the present invention, a space for absorbing a stress may be formed between the chip cavity of the inner conductive-via provided insulating substrate of the superposed substrate and the semiconductor element accommodated in the chip cavity. The space may be filled with flexible adhesive agent.

In the semiconductor device according to the second of the present invention claim 8, the semiconductor device may further comprise a lower, outer conductive-via provided insulating substrate which is superposed on the wiring printed substrate of an lowermost superposed substrate, the outer conductive-via provided insulating substrate having a plurality of contact electrodes formed in a plurality of via holes formed in the outer conductive-via provided insulating substrate in such a manner that the contact electrodes are buried in the via holes, an upper surface of the lower conductive-via provided insulating substrate being in contact with the wiring printed substrate of the lowermost superposed substrate in such a manner that the plurality of contact electrodes of the lower conductive-via provided insulating substrate are electrically connected to the plurality of contact electrodes in the wiring printed substrate of the lowermost superposed substrate and a lower surface of the lower conductive-via provided insulating substrate having a plurality of external terminals connected to the plurality of contact electrodes formed in the plurality of the holes in the lower conductive-via provided insulating substrate. A space for absorbing a stress may be formed between the chip cavity of the inner conductive-via provided insulating substrate of the superposed substrate and the semiconductor element accommodated in the chip cavity. The space may be filled with flexible adhesive agent.

According to a third aspect of the present invention, there is provided a method for manufacturing a semiconductor device comprising the steps of: forming a plurality of wiring printed substrates each having a plurality of contact electrodes formed in a plurality of via holes formed in a wiring printed substrate in such a manner that the contact electrodes are buried in the via holes and a plurality of wiring conductors electrically connected to the contact electrodes; loading a semiconductor element on each of the wiring printed substrates; electrically connecting the semiconductor element loaded on the wiring printed substrate to the wiring conductor of the wiring printed substrate; forming a plurality of inner conductive-via provided insulating substrates each having a chip cavity larger than the size of the semiconductor element for accommodating the semiconductor element loaded on the wiring printed substrate and a plurality of contact electrodes formed in a plurality of via holes formed in an inner conductive-via provided insulating substrate in such a manner that the contact electrodes are buried in the via holes, and each having a lower surface with an adhesive agent layer; superposing one of the conductive-via provided insulating substrates and one of the wiring printed substrate in such a manner that the contact electrodes of the conductive-via provided insulating substrate and the contact electrodes of the wiring printed substrate are electrically connected to each other and in such a manner that the semiconductor element loaded on the wiring printed substrate is accommodated in the chip cavity in the conductive-via provided insulating substrate so as to constitute a superposed substrate; and bonding one of the conductive-via provided insulating substrates and one of the wiring printed substrates of the superposed substrate to each other with the adhesive agent so as to integrate the substrates.

In the method for manufacturing a semiconductor device according to the third aspect of the present invention, the manufacturing method may further comprise a step of cutting the superposed substrate in a direction of the superposition after the step of the integration.

In the method for manufacturing a semiconductor device according to the second aspect of the present invention, the semiconductor element may be substantially 30 to 200 $\mu$m in thickness.

According to a fourth aspect of the present invention, there is provided a method for manufacturing a semiconductor device comprising the steps of: forming a plurality of wiring printed substrates in each of which a wiring conductor is formed on a main surface thereof; loading a semiconductor element on each of the wiring printed substrates; electrically connecting the semiconductor element loaded on the wiring printed substrate to the wiring conductor of the wiring printed substrate; forming a plurality of inner conductive-via provided insulating substrates each having a chip cavity larger than a size of the semiconductor element for accommodating the semiconductor element loaded on the wiring printed substrate, and each having a lower surface with an adhesive agent layer; superposing the plurality of conductive-via provided insulating substrates and the plurality of wiring printed substrates alternately in such a manner that the semiconductor element loaded on the wiring printed substrate is accommodated in the chip cavity in the conductive-via provided insulating substrate so as to form an superposed structure of the substrates; integrating the conductive-via provided insulating substrates with the wiring printed substrates by bonding the plurality of the conductive-via provided insulating substrates and the plurality of the wiring printed substrates of the superposed structure; forming a plurality of via holes in the superposed structure which penetrates through the superposed structure; and forming a plurality of contact electrodes in the plurality of the via holes.

In the method for manufacturing a semiconductor device according to the fourth aspect of the present invention, the manufacturing method may further comprise a step of cutting the superposed substrate in a direction of the superposition after the step of the integration.

In the method for manufacturing a semiconductor device according the fourth aspect of the present invention, the semiconductor element may be substantially 30 to 200 $\mu$m in thickness.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, embodiments of the present invention will be described with reference to the accompanying drawings.

First, the semiconductor device of the first embodiment of the present invention will be described with reference to FIGS. 1A, 1B, 4, and 5.

Figure 1A:
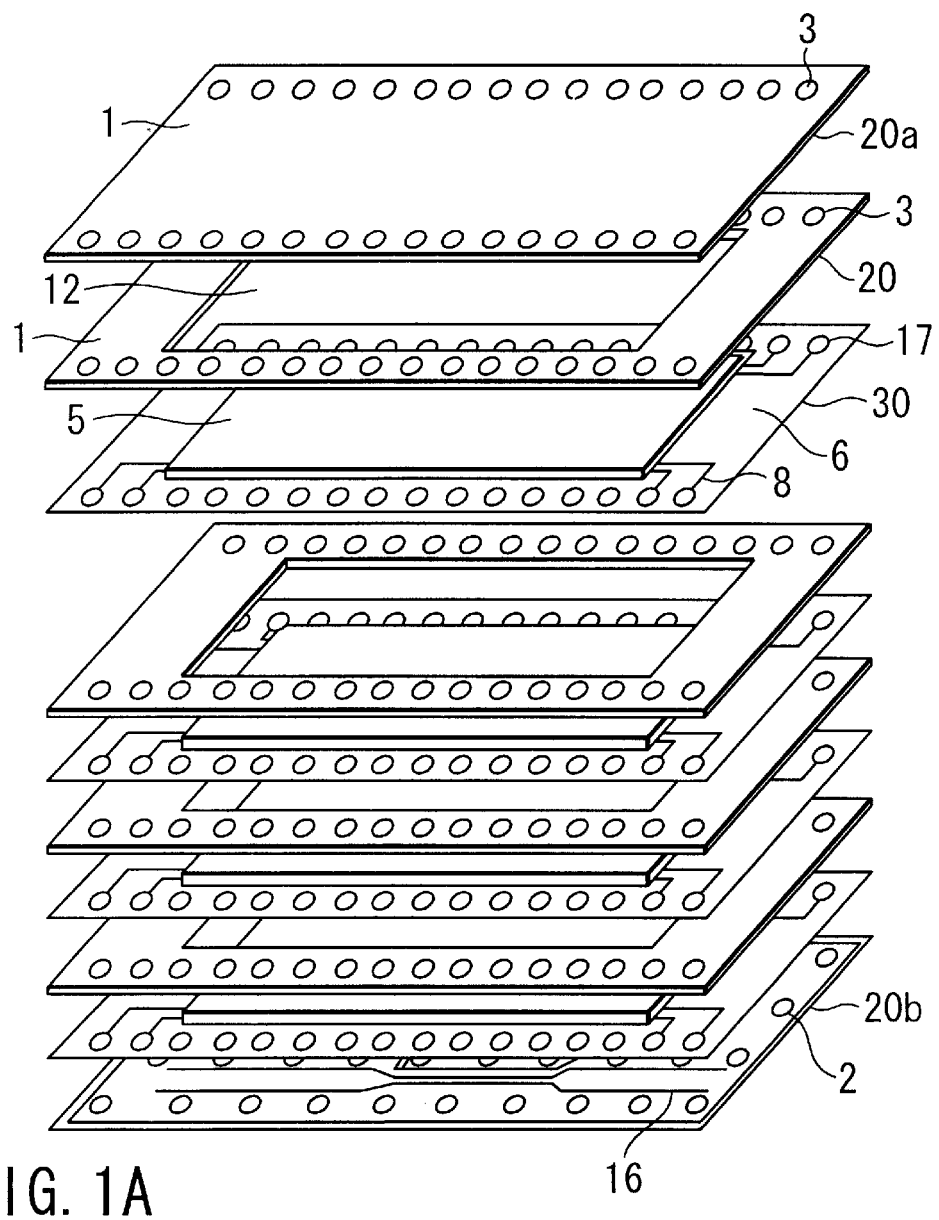
FIG. 1A is an exploded perspective view of a semiconductor device according to a first embodiment of the present invention.
Figure 1B:
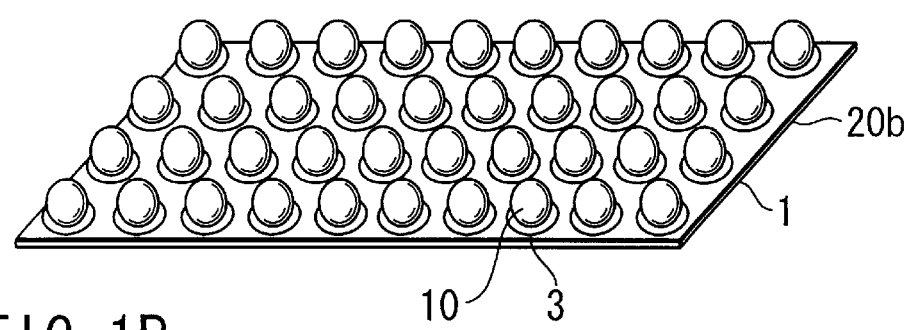
FIG. 1B is a perspective view of a lower, outer conductive-via provided insulating substrate of the semiconductor device of FIG. 1A, in which the insulating substrate is upside down to show the lower surface of the insulating substrate, and shows, in particular, external terminals of the lower insulating substrate in the practical shape.
Figure 4:
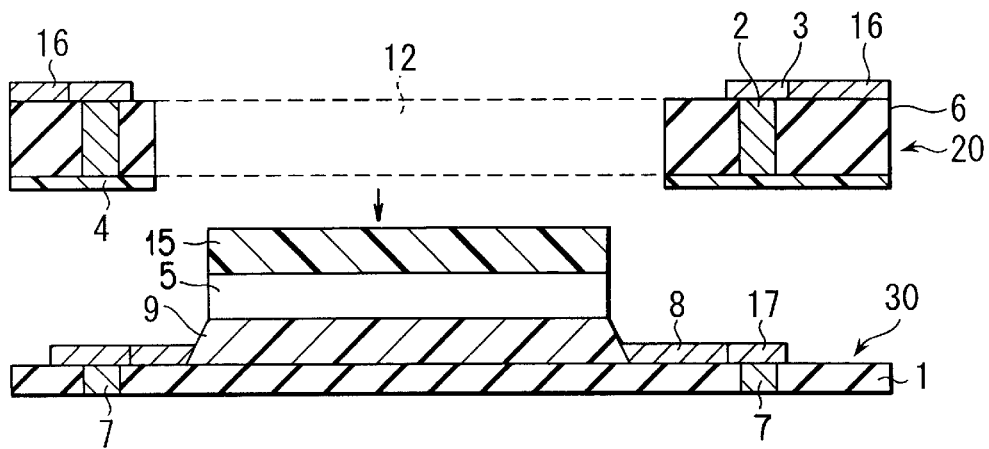
FIG. 4 is a sectional view of the inner conductive-via provided insulating substrate and the wiring printed substrate in a superposing step of the method of manufacturing the semiconductor device according to the first embodiment of the present invention.
Figure 5:
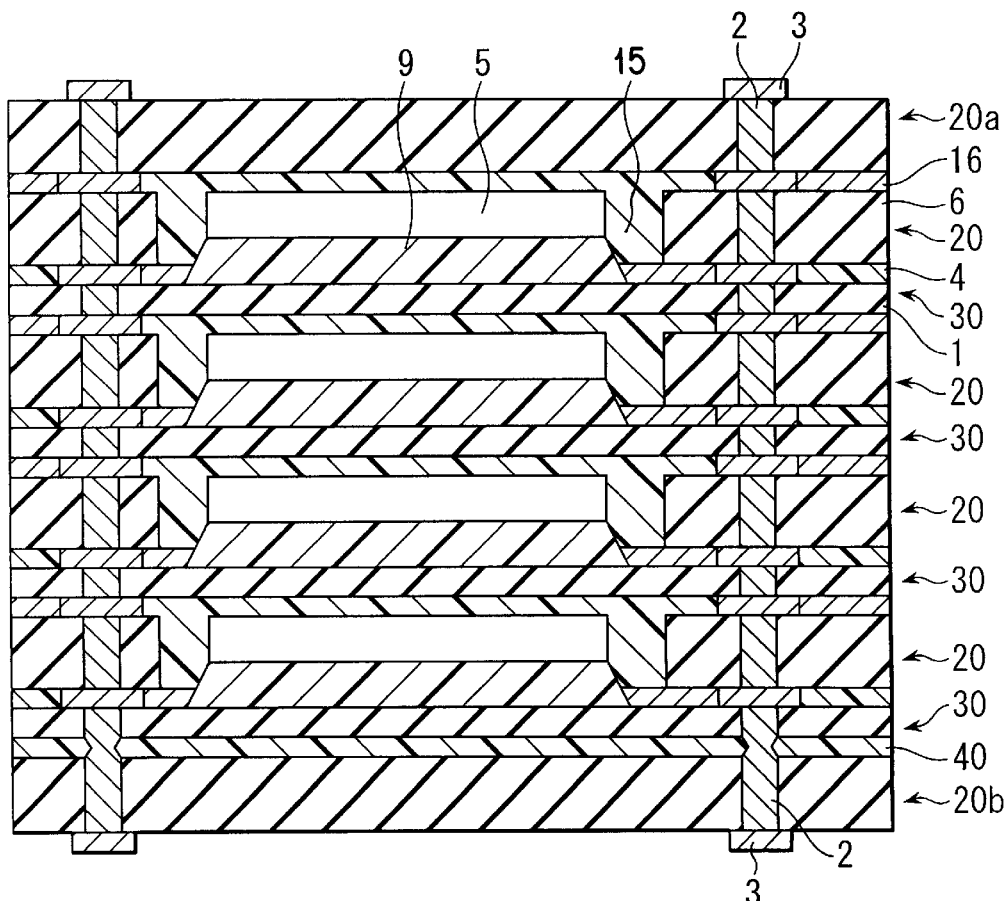
FIG. 5 is a sectional view of the semiconductor device manufactured by the manufacturing method according to the first embodiment of the present invention.

FIG. 1A is an exploded perspective view of the semiconductor device according to a first embodiment of the present invention. FIG. 1B is a perspective view of a lower, outer conductive-via provided insulating substrate of the semiconductor device of FIG. 1A, in which the insulating substrate is upside down to show the lower surface of the insulating substrate, and shows, in particular, external terminals of the lower insulating substrate in the practical shape. FIG. 4 is a sectional view of the inner conductive-via provided insulating substrate and the wiring printed substrate in a superposing step of the method of manufacturing the semiconductor device according to the first embodiment of the present invention. FIG. 5 is a sectional view of the semiconductor device manufactured by the manufacturing method according to the first embodiment of the present invention.

Although according to the first embodiment of the present invention, four semiconductor elements are superposed, the number of the semiconductor elements in the present invention is not restricted to four. It is possible to superpose a necessary number of the semiconductor elements, which is two or more. The superposed type package is comprised of a conductive-via provided insulating substrate 20 having an opening 12 in the center thereof for accommodating a semiconductor element 5, a wiring printed substrate 30 which carries the semiconductor element 5, an upper, outer conductive-via provided insulating substrate 20a constituting an upper cover plate, and a lower, outer conductive-via provided insulating substrate 20b constituting a lower cover plate and having external terminals 10. That is, in the superposed type package, superposed layers each including the conductive-via provided insulating substrates 20 and the wiring printed substrates 30 superposed to each other are superposed between the upper layer conductive-via provided insulating substrate 20a and the lower conductive-via provided insulating substrate 20b. The superposed layers are heated with pressure so that they are integrated together (FIG. 5).

An insulating substrate 1 in which copper foil is formed on the surface thereof as a conductive film, for example, a polyimide substrate in which a copper foil of about 40 μm in thickness is formed on the surface is utilized as the wiring printed substrate 30 for carrying the semiconductor element. The conductive film is not restricted to copper foil, and any conductive material film suitable for the wiring conductor layer can be used. The thickness of the conductive film of about 40 μm is just an ordinary value and therefore the thickness is not restricted to this value. As the wiring printed substrate 30, it is permissible to use an insulating substrate comprised of multiple layers of the polyimide substrates each in which the conductive film is formed on the surface thereof. Via holes are provided in the insulating substrate 6 and a contact electrode 7 is buried in each via hole. The copper foil on the insulating substrate 1 is patterned and lands 17 are formed on the contact electrodes 7 by the patterned copper foil. Wirings 8 electrically connected to the conductor element 5 are formed by the patterned copper foil. The thickness (substantially, the thickness of a silicon chip) of the semiconductor element 5 is about 30 to 200 μm, preferably about 50 to 150 μm (FIG. 4).

As the conductive-via provided insulating substrate 20, the insulating substrate 6 in which a conductive film of copper foil is formed on the surface thereof is utilized, like the polyimide substrate in which copper foil of about 75 μm in thickness is formed on the surface thereof. The conductive film is not restricted to copper foil, and any conductive material film suitable for a wiring conductor layer may be used. The thickness of the conductive film of about 75 μm is just an ordinary value and therefore the thickness is not restricted to this value. As the conductive-via provided insulating substrate 20, it is permissible to use an insulating substrate comprised of multiple layers of the polyimide substrates each in which the conductive film is formed on the surface thereof. Via holes are provided in the insulating substrate 6 and a contact electrode 2 is buried in each via hole. The copper foil on the insulating substrate 6 is patterned and the lands 3 are formed on the contact electrodes 2 with the patterned copper foil. Further, the wiring conductors 16 are formed by the patterned copper foil. An opening (chip cavity) 12 for accommodating the semiconductor element 5 is formed in the center of the insulating substrate 6. The size of the cavity 12 is larger than that of the semiconductor element 5 to accommodate the semiconductor element 5 in the cavity 12. A thermosetting adhesive agent 4 such as epoxy resin is applied to the lower surface of the conductive-via provided insulating substrate 20 (FIG. 4). Such adhesive agent 4 may be applied to both of the lower and upper surfaces of the insulating substrate 6.

The conductive-via provided insulating substrate 20 and the wiring printed substrate 30 are superposed and integrated to each other by adhesive agent 4 charged in the chip cavity 12 to form a superposed substrate (FIG. 4). That is, the conductive-via provided insulating substrate 20 and the wiring printed substrate 30 are pressured in opposing directions while being heated to integrate the substrates 20 and the substrate 30. When the conductive-via provided insulating substrate 20 and the wiring printed substrate 30 are pressured in opposing directions while being heated, then the substrates 20 and the substrate 30 are integrated to each other by adhesive agent 4 which is coated on the lower surface of the conductive-via provided insulating substrate 20. Also, when the conductive-via provided insulating substrate 20 and the wiring printed substrate 30 are pressured in opposing directions, a flexible material of an flexible adhesive film 15 made of, for example silicone resin, provided on the surface of the semiconductor element is charged into a space between the semiconductor element and the inner wall of the chip cavity 12.

Via holes are provided in the upper conductive-via provided insulating substrate 20a, and the contact electrode 2 is buried in each via hole (FIG. 5). The land 3 is formed on each contact electrode 2. The upper conductive-via provided insulating substrate 20a is provided with a wiring conductor, if it is necessary.

The lower conductive-via provided insulating substrate 20b also includes via holes and the contact electrode 2 is buried in the via hole (FIG. 5). The lower conductive-via provided insulating substrate 20b contains the wiring conductors 16 and lands 3 and the external terminals 10 are formed on the rear face thereof (FIGS. 1A and 1B).

One surface of the lower conductive-via provided insulating substrate 20b is in contact with the lower surface of the wiring printed substrate 30 of the lowermost superposed substrate so that the contact electrodes 2 the lower conductive-via provided insulating substrate 20b are electrically connected to the contact electrodes 7 of the lower surface of the wiring printed substrate 30 of the lowermost superposed substrate. The external terminals 10 are formed on the other surface of the conductive-via provided insulating substrate 20b, and electrically connected to the contact electrodes 2 of lower conductive-via provided insulating substrate 20b. In FIG. 5, the external terminals 10 are omitted for simplicity.

With such a structure, the semiconductor device comprised of thin superposed type package can be obtained. Further, since the superposed structure comprising a plurality of superposed substrates (in this embodiment, four superposed substrates) each composed of the conductive-via provided insulating substrate 20 and the wiring printed substrate 30 is sandwiched between the upper and lower conductive-via provided insulating substrates, airproof of the semiconductor elements is secured. Further, the semiconductor element is accommodated in the chip cavity formed in the conductive-via provided insulating substrate of each superposed substrate. Since the chip cavity is smaller than the semiconductor element, when the semiconductor element is accommodated in the chip cavity, there is formed a space between the semiconductor element and an inner wall of the chip cavity. A flexible adhesive agent such as elastomer, for example silicone resin, is filled in this space. By filling such an adhesive agent, airproof is increased so that moisture resistance of the semiconductor element is improved. Furthermore, since the adhesive agent is flexible, then stress can be absorbed. Therefore, even if the semiconductor device is a little bent and thus the semiconductor element is elongated, the flexible adhesive agent absorbs the elongation of the semiconductor element. That is, even if an external force is applied to the semiconductor device, a generated stress can be absorbed by the flexible adhesive agent. The flexible adhesive agent need not necessarily be provided, and the space may leave as it is. Even the space can absorb the elongation of the semiconductor element.

A second embodiment of the present invention will be described with reference to FIGS. 2A, 2B, 3A, 3B, 4 and 5.

Figure 2A:
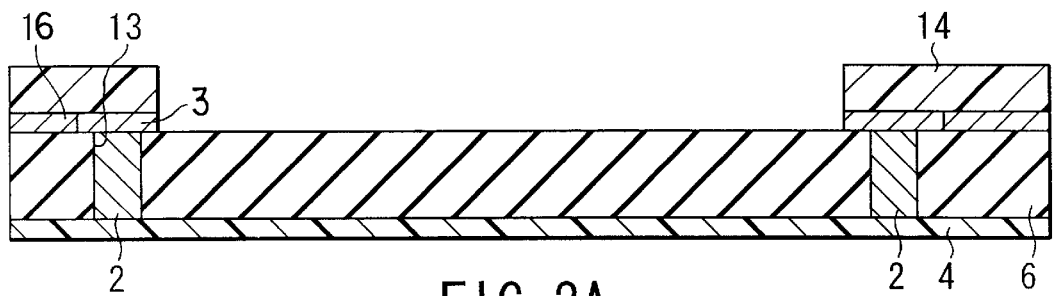
FIG. 2A is a sectional view of an upper or inner conductive-via provided insulating substrate in a step of a method of manufacturing the semiconductor device according to the first embodiment of the present invention.
Figure 2B:
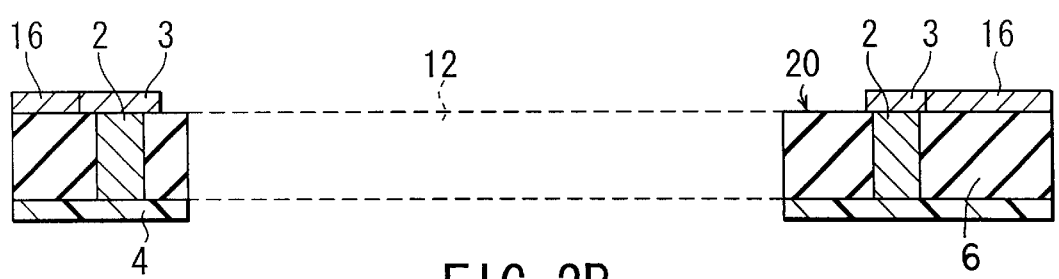
FIG. 2B is a sectional view of the inner conductive-via provided insulating substrate in a step of the method of manufacturing the semiconductor device according to the first embodiment of the present invention.
Figure 3A:
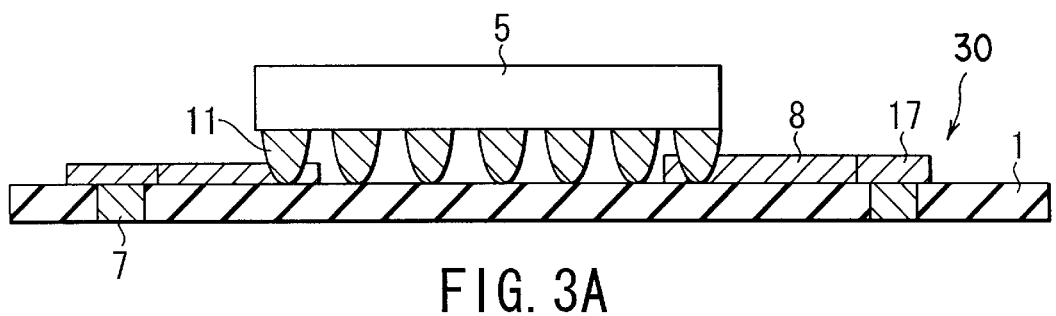
FIG. 3A is a sectional view of a wiring printed substrate in a step of the method of manufacturing the semiconductor device according to the first embodiment of the present invention.
Figure 3B:
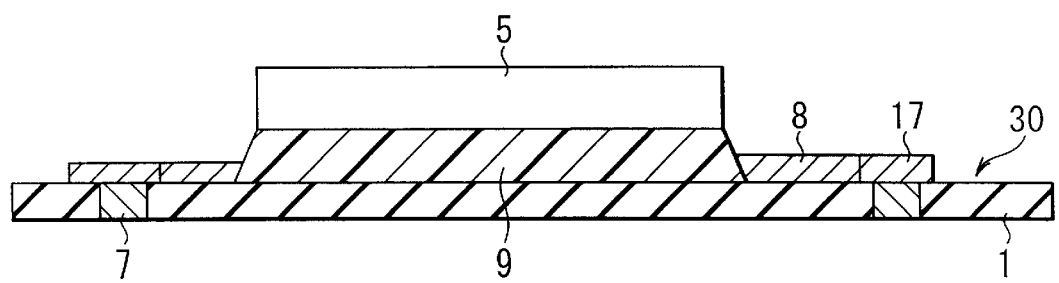
FIG. 3B is a sectional view of the wiring printed substrate in a step of the method of manufacturing the semiconductor device according to the first embodiment of the present invention.

FIG. 2A is a sectional view of an upper or inner conductive-via provided insulating substrate in a step of a method of manufacturing the semiconductor device shown in FIGS. 1 and 5. FIG. 2B is a sectional view of the inner conductive-via provided insulating substrate in a step of the method of manufacturing the semiconductor device shown in FIGS. 1 and 5. FIG. 3A is a sectional view of a wiring printed substrate in a step of the method of manufacturing the semiconductor device shown in FIGS. 1 and 5. FIG. 3B is a sectional view of the wiring printed substrate in a step of the method of manufacturing the semiconductor device shown in FIGS. 1 and 5. FIG. 4 is a sectional view of the inner conductive-via provided insulating substrate and the wiring printed substrate in a superposing step of the method of manufacturing the semiconductor device according to the first embodiment of the present invention. FIG. 5 is a sectional view of the semiconductor device manufactured by the manufacturing method according to the first embodiment of the present invention.

As the conductive-via provided insulating substrate, the insulating substrate 6 in which a conductive film of copper foil is formed on the surface thereof is utilized, like the polyimide substrate in which copper foil of about 75 μm in thickness is formed on the surface thereof. The conductive film is not restricted to copper foil, and any conductive material film suitable for a wiring conductor layer may be used. The thickness of the conductive film of about 75 μm is just an ordinary value and therefore the thickness is not restricted to this value. As the conductive-via provided insulating substrate, it is permissible to use an insulating substrate comprised of multiple layers of the polyimide substrates each in which the conductive film is formed on the surface thereof.

First, via holes 13 are formed at portions of the insulating substrate 6 in which the contact electrodes 2 are to be buried using YAG laser, carbon dioxide gas laser or the like. Then, after resist films 14 are formed on regions corresponding to the via and the wiring conductor, the copper foil formed on the insulating substrate 6 is etched, using the resist films 14 as masks, so as to form the land 3 and the wiring conductor patterns 16. Thereafter, the masks 14 are removed. After that, silver filler or copper filler contained conductive resin paste is screen-printed into the via holes 13 from the lower surface of the insulating substrate 6 so as to form the contact electrodes 2 in the via holes 13. As the method for forming the contact electrodes 2, it is permissible to plate an inner walls of the via holes with copper or gold and then fill the via holes with conductive material. Thereafter, thermosetting adhesive agent 4 such as epoxy resin is applied to the lower face of the insulating substrate 6. With the above manufacturing steps, an upper, outer conductive-via provided insulating substrate 20a is formed (FIG. 2A). When forming a conductive-via provided insulating substrate 20, the substrate shown in FIG. 2A is further processed so that a region in which the semiconductor element is to be accommodated of the insulating substrate 6 is punched out (FIG. 2B). The punched-out region is used as the chip cavity 12.

An insulating substrate 1 in which copper foil is formed on the surface thereof as a conductive film, for example, a polyimide substrate in which a copper foil of about 40 μm in thickness is formed on the surface is utilized as the wiring printed substrate 30 for carrying the semiconductor element. The conductive film is not restricted to copper foil, and any conductive material film suitable for the wiring conductor layer can be used. The thickness of the conductive film of about 40 μm is just an ordinary value and therefore the thickness is not restricted to this value. As the wiring printed substrate 30, it is permissible to use an insulating substrate comprised of multiple layers of the polyimide substrates each in which the conductive film is formed on the surface thereof.

Via holes are formed at portions of the insulating substrate 1 of the wiring printed substrate 30 in which the contact electrodes 7 are to be buried using YAG laser, carbon dioxide laser or the like. Then, after masks (not shown) are formed at regions corresponding to the via holes and the wiring conductors of the insulating substrate 1, the copper foil is etched so as to form the lands 17 and the wiring conductor patterns 8. After that, silver filler or copper filler contained conductive resin paste is screen-printed in the via holes so as to form the contact electrodes 7 in the via holes 13. As the method for forming the contact electrodes 7, it is permissible to plate an inner walls of the via holes with copper or gold and then fill the via holes with conductive material. According to flip-chip method or the like, the semiconductor element (semiconductor chip) 5 is loaded on the wiring printed substrate 30 by die bonding. When the semiconductor element 5 is loaded on the wiring printed substrate 30, the contact electrodes 11 such as soldering ball are connected to the wiring conductor patterns 8 (FIG. 3A). Thus, the semiconductor element 5 is electrically connected to the contact electrodes 7 of the wiring printed substrate 30 through the wiring conductor patterns 8. The contact electrodes 11 are covered with and protected by a flexible adhesive agent 9 such as silicone resin (FIG. 3B). Furthermore, a film 15 made of a flexible adhesive agent such as silicone resin is formed on the surface of the semiconductor element 5 (FIG. 3C). The film 15 and the adhesive agent 9 may be the same material, for example, silicone resin. The film 15 is not shown in FIGS. 3A and 3B for simplicity.

Then, the conductive-via provided insulating substrate 20 is positioned and superposed on the wiring printed substrate 30 to form a superposed substrate. When the conductive-via provided insulating substrate 20 is positioned and superposed on the wiring printed substrate 30, the conductive-via provided insulating substrate 20 and the wiring printed substrate 30 are positioned such that the semiconductor element 5 loaded on the wiring printed substrate 30 is disposed in the chip cavity 12 of the conductive-via provided insulating substrate 20 (FIG. 4) and the contact electrodes 2 of the conductive-via provided insulating substrate 20 are electrically connected to the contact electrodes 7 of the wiring printed substrate 30. In this embodiment, the superposed structure includes four such superposed substrates. The upper conductive-via provided insulating substrate 20a and the lower conductive-via provided insulating substrate 20b are provided on the upper surface and the lower surface of the superposed structure, respectively. The superposed structure is pressed with a heating press machine such as a vacuum press at a hardening temperature of the adhesive agent 4 to provide the semiconductor device of a superposed type package (FIG. 5).

In the superposed structure shown in FIG. 5, four pieces of semiconductor elements 5 are superposed. This superposed structure is sandwiched between the upper conductive-via provided insulating substrate 20a in which the chip cavity is not formed and the lower conductive-via provided insulating substrate 20b in which the chip cavity is not formed. As a result, the semiconductor elements 5 are sealed completely so that the reliability of the package structure is improved.

Next, a second embodiment of the present invention will be described with reference to FIG. 6.

Figure 6:
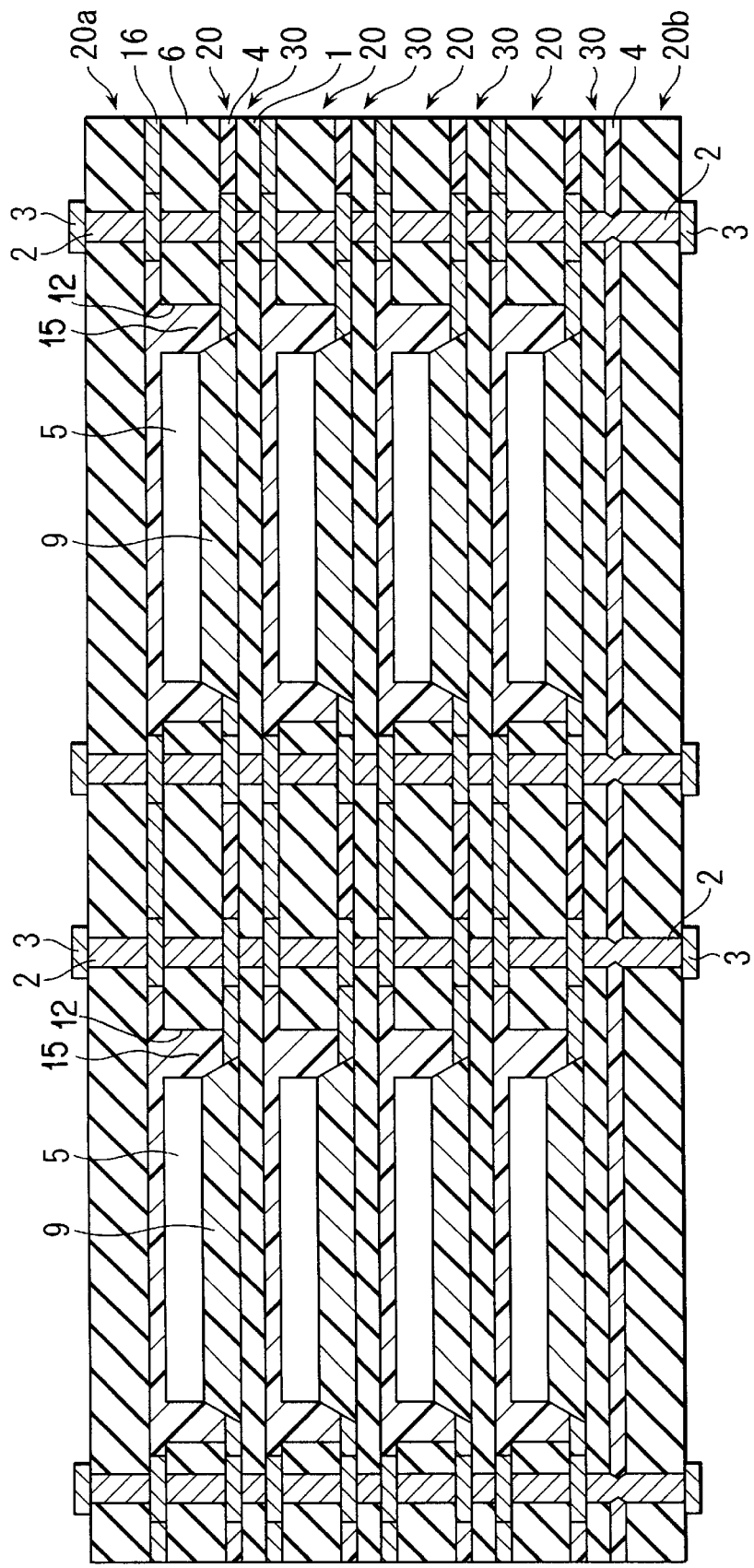
FIG. 6 is a sectional view of a semiconductor device manufactured by a manufacturing method according to a second embodiment of the present invention.

FIG. 6 is a sectional view of a semiconductor device manufactured by a manufacturing method according to the second embodiment of the present invention;

In this embodiment, a plurality of chip cavities 12 are formed in the conductive-via provided insulating substrate 20, and a plurality of semiconductor elements 5 are loaded on the wiring printed substrate 30. This embodiment is substantially the same as the first embodiment except for this feature.

That is, the semiconductor device of this embodiment comprises a plurality of the conductive-via provided insulating substrates 20 each having a plurality of chip cavities 12 (in this embodiment, two chip cavities) and a plurality of the wiring printed substrates 30 (in this embodiment, four wiring printed substrates) each having a plurality of semiconductor elements 5 (in this embodiment, two semiconductor elements). The conductive-via provided insulating substrate 20 and the wiring printed substrate 30 are alternately superposed to form a superposed structure. The superposed structure is cut out along an outer shape of each package, i.e., along a semiconductor element region as a unit to form individual superposed packages, thereby increasing the effectiveness in manufacturing the semiconductor device with the superposed type package. In FIG. 6, the corresponding portions or parts to those in FIG. 5 are denoted by the same reference numerals.

That is, the semiconductor device of this embodiment comprises a plurality of the conductive-via provided insulating substrates 20 each having a plurality of chip cavities 12 (in this embodiment, two chip cavities) and a plurality of the wiring printed substrates 30 (in this embodiment, four wiring printed substrates) each having a plurality of semiconductor elements 5 (in this embodiment, two semiconductor elements). The conductive-via provided insulating substrate 20 and the wiring printed substrate 30 are alternately superposed to form a superposed structure. The upper conductive-via provided insulating substrate 40a and the lower conductive-via provided insulating substrate 40b are provided on the upper surface and the lower surface of the superposed structure, respectively.

Specifically, the semiconductor device shown in FIG. 6 comprises four inner conductive-via provided insulating substrates 20 each having two chip cavities 12 and four wiring printed substrates 30 each having four semiconductor elements 5, an upper, outer conductive-via provided insulating substrate 20a constituting an upper cover plate, and a lower, outer conductive-via provided insulating substrate 20b constituting a lower cover plate. That is, in the superposed type package, superposed substrates each including the conductive-via provided insulating substrates 20 and the wiring printed substrates 30 superposed to each other are superposed between the upper layer conductive-via provided insulating substrate 20a and the lower conductive-via provided insulating substrate 20b. The superposed layers are heated with pressure so that they are integrated together. The superposed structure is cut out along an outer shape of each package, i.e., along a semiconductor element region as a unit to form individual superposed packages.

As described above, in this embodiment, a plurality of the conductive-via provided insulating substrates 20 each having a plurality of chip cavities 12 and a plurality of the wiring printed substrates 30 each having a plurality of semiconductor elements 5 are alternately superposed to form a superposed structure, and the superposed structure is cut out along a semiconductor element region as a unit to form individual superposed packages. These features increase the effectiveness in manufacturing the semiconductor device with the superposed type package.

Furthermore, in this embodiment, the same advantages as those provided in the first embodiment can be obtained. That is, since the superposed structure comprising a plurality of superposed substrates each composed of the conductive-via provided insulating substrate 20 and the wiring printed substrate 30 is sandwiched between the upper and lower conductive-via provided insulating substrates, airproof to the semiconductor elements is secured. Further, the semiconductor element is accommodated in the chip cavity formed in the conductive-via provided insulating substrate of each superposed substrate. Since the chip cavity is smaller than the semiconductor element, when the semiconductor element is accommodated in the chip cavity, there is formed a space between the semiconductor element and an inner wall of the chip cavity. A flexible adhesive agent such as elastomer, for example silicone resin, is filled in this space. By filling such an adhesive agent, airproof is increased so that moisture resistance of the semiconductor element is improved. Furthermore, since the adhesive agent is flexible, then stress can be absorbed. Therefore, even if the semiconductor device is a little bent and thus the semiconductor element is elongated, the flexible adhesive agent absorbs the elongation of the semiconductor element. That is, even if an external force is applied to the semiconductor device, a generated stress can be absorbed by the flexible adhesive agent. The flexible adhesive agent need not necessarily be provided, and the space may leave as it is. Even the space can absorb the elongation of the semiconductor element.

A third embodiment of the present invention will be described with reference to FIGS. 7A to 7F.

Figure 7A:
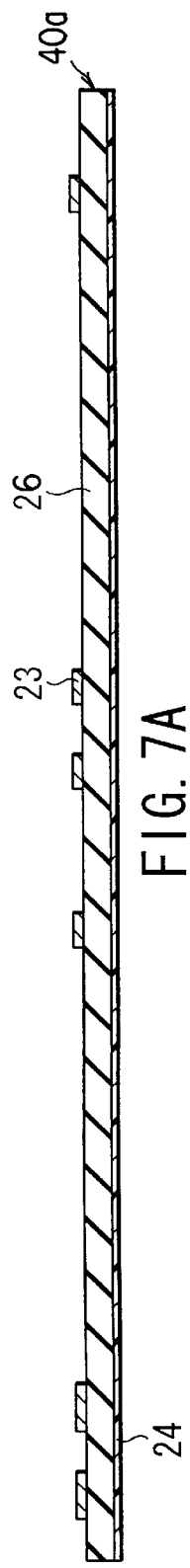
FIG. 7A is a sectional view of an upper, outer conductive-via provided insulating substrate in a step of a method of manufacturing a semiconductor device according to a third embodiment of the present invention.
Figure 7B:
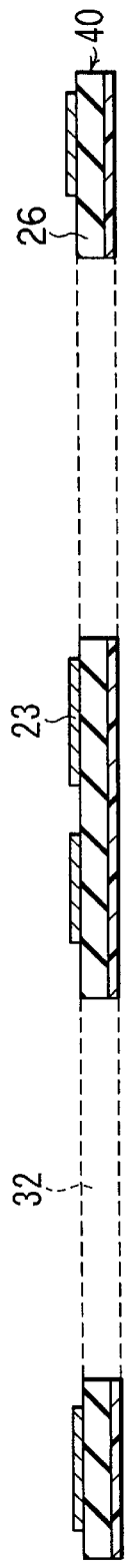
FIG. 7B is a sectional view of an inner conductive-via provided insulating substrate in a step of the method of manufacturing the semiconductor device according to the third embodiment of the present invention.
Figure 7C:
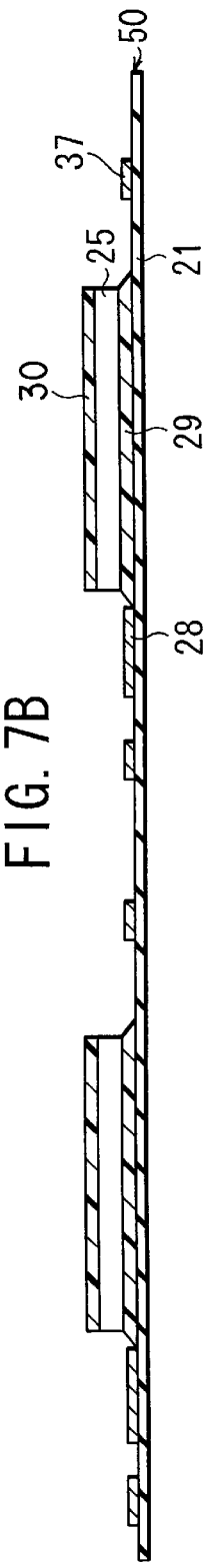
FIG. 7C is a sectional view of a wiring printed substrate in a step of the method of manufacturing the semiconductor device according to the third embodiment of the present invention.
Figure 7D:
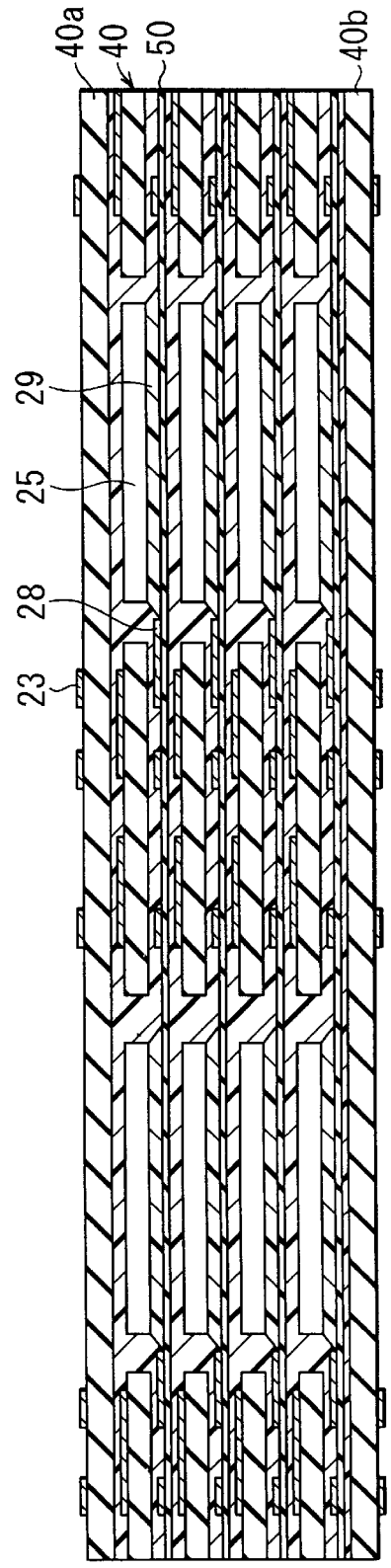
FIG. 7D is a sectional view of a superposed structure in a step of the method of manufacturing the semiconductor device according to the third embodiment of the present invention.
Figure 7E:
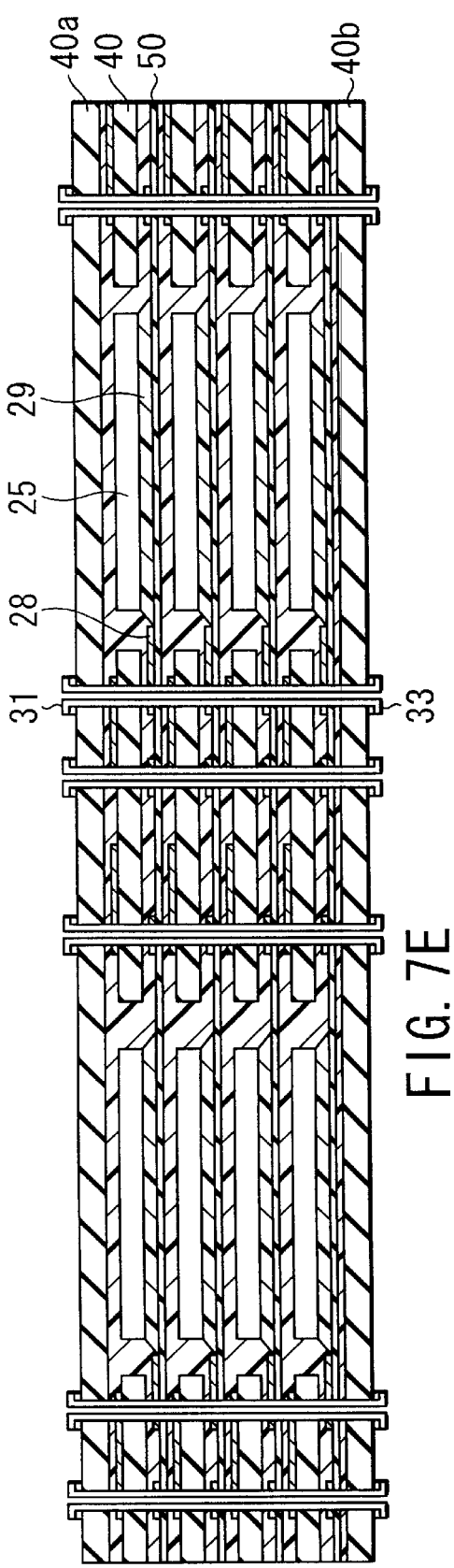
FIG. 7E is a sectional view of the superposed structure in a step of the method of manufacturing the semiconductor device according to the third embodiment of the present invention.
Figure 7F:
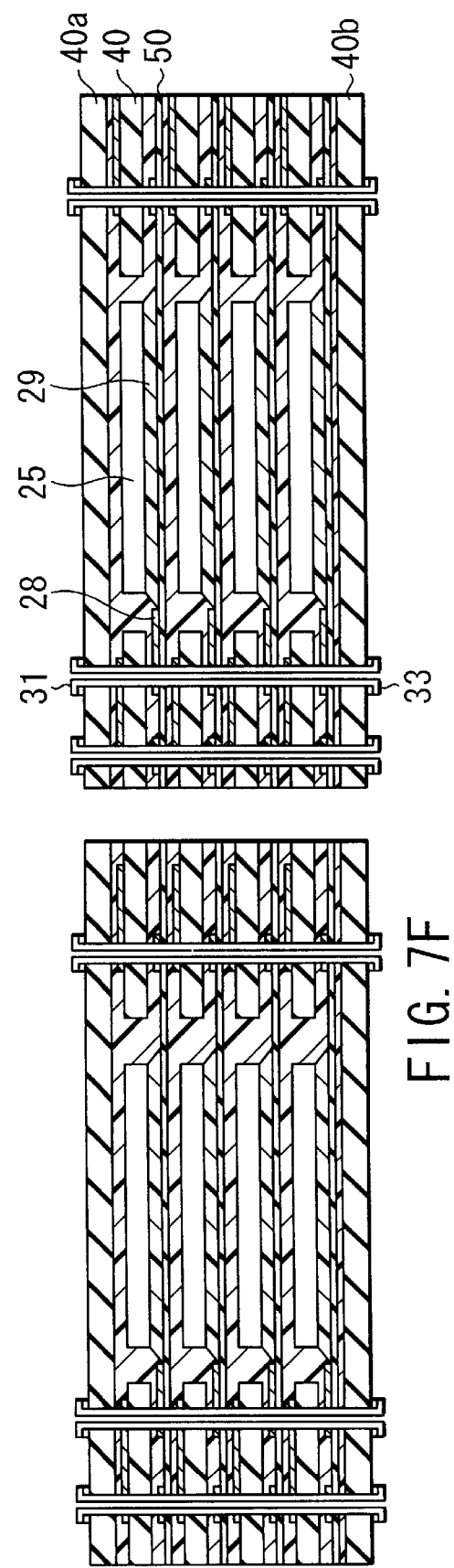
FIG. 7F is a sectional view of the semiconductor device manufactured by the manufacturing method according to the third embodiment of the present invention.

FIG. 7A is a sectional view of an upper, outer conductive-via provided insulating substrate 40a in a step of a method of manufacturing a semiconductor device according to a third embodiment of the present invention. FIG. 7B is a sectional view of an inner conductive-via provided insulating substrate 40 in a step of the method of manufacturing the semiconductor device according to the third embodiment of the present invention. FIG. 7C is a sectional view of a wiring printed substrate 50 in a step of the method of manufacturing the semiconductor device according to the third embodiment of the present invention. FIG. 7D is a sectional view of a superposed structure in a step of the method of manufacturing the semiconductor device according to the third embodiment of the present invention. FIG. 7E is a sectional view of the superposed structure in a step of the method of manufacturing the semiconductor device according to the third embodiment of the present invention. FIG. 7F is a sectional view of the semiconductor device manufactured by the manufacturing method according to the third embodiment of the present invention.

In this embodiment, as in the second embodiment, a plurality of chip cavities 32 are formed in the conductive-via provided insulating substrate 40, and a plurality of semiconductor elements 25 are loaded on the wiring printed substrate 50.

That is, the semiconductor device of this embodiment comprises a plurality of the conductive-via provided insulating substrates 40 each having a plurality of chip cavities 32 (in this embodiment, two chip cavities) and a plurality of the wiring printed substrates 50 (in this embodiment, four wiring printed substrates) each having a plurality of semiconductor elements 25 (in this embodiment, two semiconductor elements). The conductive-via provided insulating substrate 40 and the wiring printed substrate 50 are alternately superposed to form a superposed structure. The upper conductive-via provided insulating substrate 40*a* and the lower conductive-via provided insulating substrate 40*b* are provided on the upper surface and the lower surface of the superposed structure, respectively.

As the conductive-via provided insulating substrate 40*a* and 40*b* and the conductive-via provided insulating substrate 40, the insulating substrate 26 in which conductive film of copper foil is formed on the surface thereof is utilized, like the polyimide substrate in which copper foil is formed on the surface thereof as conductive film. The conductive film is not restricted to copper foil and any conductive material film suitable for the wiring conductor layer may be used. As the conductive-via provided insulating substrate 40*a* and 40*b* and the conductive-via provided insulating substrate 40, it is permissible to use such a superposed substrate comprised of plural superposed polyimide substrates each in which conductive film of copper foil is formed on the surface thereof.

In forming the outer, upper conductive-via provided insulating substrate 40*a,* masks (not shown) are formed on region corresponding to the via holes and the wiring conductors of the insulating substrate 26. Then, the copper foil is etched so as to form the lands 23 and the wiring conductor patterns. Thermosetting adhesive agent 24 such as epoxy resin is applied to the lower surface of the insulating substrate 26 (FIG. 7A). Similarly, in forming the inner conductive-via provided insulating substrate 40, masks (not shown) are formed on region corresponding to the via holes and the wiring conductors of the insulating substrate 26. Thermosetting adhesive agent 24 such as epoxy resin is applied to the lower surface of the insulating substrate 26. A region of the insulating substrate 26 in which the semiconductor element is to be accommodated is punched out so that it is used as the chip cavity 32 (FIG. 7B). According to this embodiment, two chip cavities are provided. It is preferable to provide two or more chip cavities to more improve effectiveness in manufacturing process.

As the wiring printed substrate 50 on which the semiconductor element 25 is to be loaded, the insulating substrate 21 in which copper foil conductive film is formed on the surface thereof is utilized, like the polyimide substrate in which the copper foil conductive film is formed on the surface thereof. The conductive film is not restricted to the copper foil, however any conductive material film suitable for the wiring conductor layer may be used. As the wiring printed substrate 30, it is permissible to use the printed superposed plate comprised of multiple superposed polyimide substrates each in which conductive film of copper foil is formed on the surface thereof. Masks (not shown) are formed on regions of the insulating substrate 21 corresponding to the via holes and the wiring conductors and after that, the copper foil is etched so as to form the lands 37 and the wiring conductor patterns 28 FIG. 7C). The surface of the semiconductor element 25 in which the contact electrodes (not shown) are provided is covered with and protected by a flexible adhesive agent 29 such as silicone resin (FIG. 3B). Furthermore, a film 30 made of a flexible adhesive agent such as silicone resin is formed on the opposite surface of the semiconductor element 25. The film 30 and the adhesive agent 29 may be the same material, for example, silicone resin.

Then, the semiconductor element 25 (semiconductor chip) is loaded on the wiring printed substrate 50 by means of, for example, the flip chip method. According to this embodiment, two semiconductor elements 25 are loaded on the wiring printed substrate 50 (FIG. 7C).

Then, the conductive-via provided insulating substrate 40 is positioned and superposed on the wiring printed substrate 50 so that the semiconductor element 25 loaded on the wiring printed substrate 50 is disposed in the chip cavity 32 of the conductive-via provided insulating substrate 40. In this embodiment, the superposed structure includes four such superposed substrates each comprising the conductive-via provided insulating substrate 40 and the wiring printed substrate 50. The upper conductive-via provided insulating substrate 40*a* and the lower conductive-via provided insulating substrate 40*b* are provided on the upper surface and the lower surface of the superposed structure, respectively. After the above positioning, the superposed structure is pressed with a heating press machine such as a vacuum press at a hardening temperature of the adhesive agent 24 to provide the semiconductor device of a superposed type package (FIG. 7D).

After that, adhesive agent 24 are hardened, through-holes 33 are formed in the lands 23, 37 using a drill having a diameter of 0.25 mm to 0.4 mm. After that, insides of the through-holes 33 and lands are plated with copper or gold so as to form the contact electrodes 31 (FIG. 7E).

After that, the above superposed structure having the contact electrodes 31 is cut out along an outer shape of each package, i.e., with a region including one semiconductor element as a unit, by means of a blade, router or the like so as to form individual superposed packages (FIG. 7E).

In this embodiment, as in the second embodiment, a plurality of chip cavities 32 are formed in the conductive-via provided insulating substrate 40, and a plurality of semiconductor elements 25 are loaded on the wiring printed substrate 50. Then, by superposing the substrates 40 and 50 alternately, an superposed structure is formed and finally, the superposed structure is cut to multiple packages by means of a blade. Consequently, effectiveness of formation of the superposed package is achieved.

Also, in the superposed structure shown in this embodiment, as in the first and second embodiments, this superposed structure is sandwiched between the upper conductive-via provided insulating substrate 40*a* in which the chip cavity is not formed and the lower conductive-via provided insulating substrate 40*b* in which the chip cavity is not formed. As a result, the semiconductor elements 25 are sealed tightly so that the reliability of the package structure is improved. External terminals (not shown) of an appropriate shape are formed on the lower conductive-via provided insulating substrate 40*b*.

The wiring printed substrates 50 loaded with the semiconductor element 25 and the conductive-via provided insulating substrate 40 are superposed and finally, by cutting the superposed structure, the superposed packages can be produced with fewer processes than the conventional manufacturing method for the package.

Next, a fourth embodiment of the present invention will be described with reference to FIG. 8.

Figure 8:
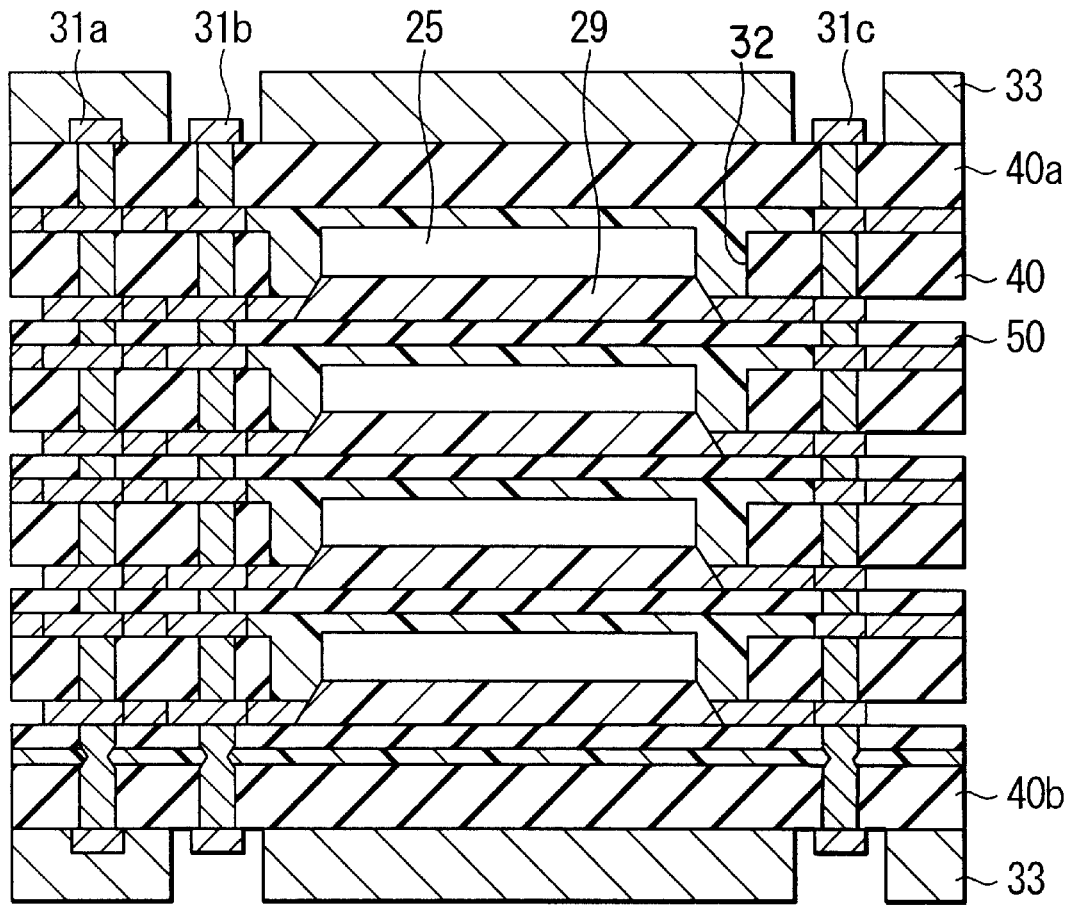
FIG. 8 is a sectional view of a semiconductor device manufactured by a manufacturing method according to a fourth embodiment of the present invention.

FIG. 8 is a sectional view of a semiconductor device manufactured by a manufacturing method according to a fourth embodiment of the present invention.

This semiconductor device is comprised of a plurality of wiring printed substrates 50 each having the semiconductor element 25 mounted thereon and a plurality of conductive-via provided insulating substrates 40 each having the chip cavity 32 which is a space for accommodating the semiconductor element 25 loaded on the wiring printed substrate 50. The conductive-via provided insulating substrates 40 and the wiring printed substrates 50 are alternately superposed so as to provide the superposed structure for the semiconductor elements. In the superposed structure of this embodiment, four pieces of semiconductor elements 25 are superposed to provide the superposed structure. This superposed structure is sandwiched between the upper conductive-via provided insulating substrate 40*a* in which the chip cavity is not formed and the lower conductive-via provided insulating substrate 40*b* in which the chip cavity is not formed, so that the semiconductor elements 25 are sealed completely thereby improving the reliability of the package structure.

In this superposed structure, the contact electrode connected to each semiconductor element 25 through the wiring conductor is formed inside the via hole. The contact electrode is comprised of a contact electrode 31*a* connected to a ground (GND) wire line, and contact electrodes 31*b*, 31*c* connected to a signal wire line. Further, metallic film 33 composed of aluminum, copper or the like is formed on the upper and lower conductive-via provided insulating substrates 40*a*, 40*b*. The metallic film 33 is formed of, for example, metallic foil. Alternatively, the metallic film 33 is formed of a metallic layer obtained by spattering aluminum or copper. This metallic film 33 is electrically connected to the contact electrode 31*a* connected to the ground wire line and not connected to the contact electrodes 31*b*, 31*c* connected to the signal wire line. By connecting the metallic film 33 to the ground wire line, shielding effect for the superposed structure is generated. By properly setting the material and thickness of the metallic film 33 and the material and width of the contact electrodes 31*a*, 31*b*, 31*c*, this effect can be enhanced.

Then, a fifth embodiment of the present invention will be described with reference to FIGS. 9A and 9B.

Figure 9A:
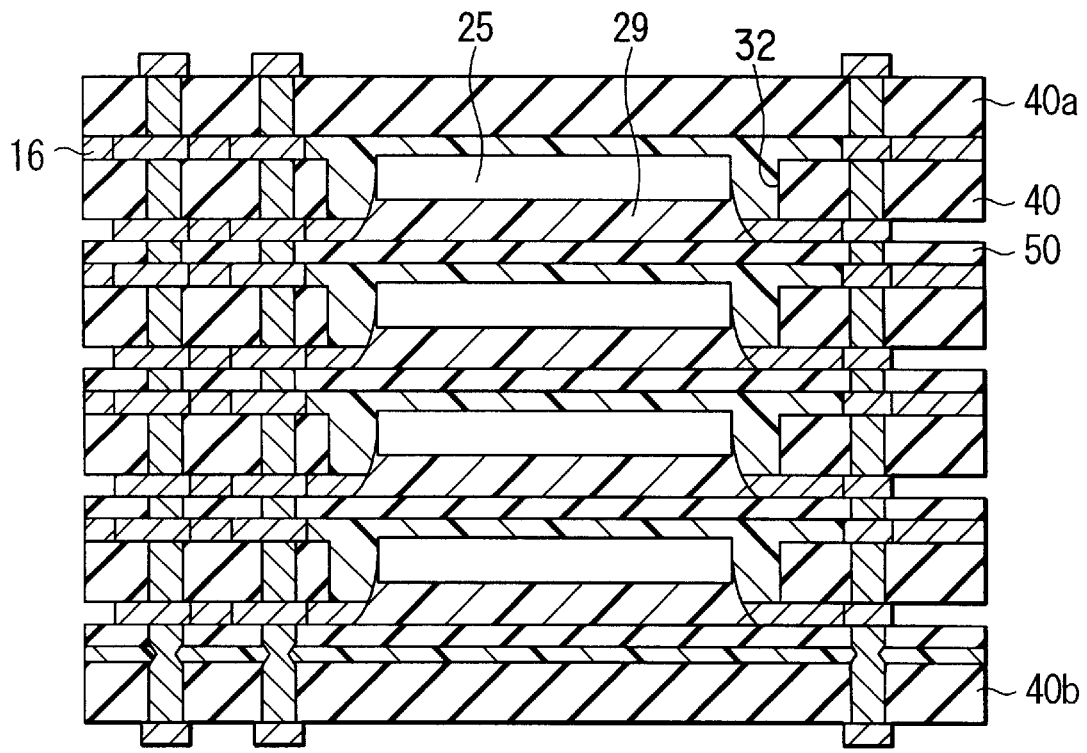
FIG. 9A is a sectional view of a semiconductor device manufactured by a manufacturing method according to a fifth embodiment of the present invention.
Figure 9B:
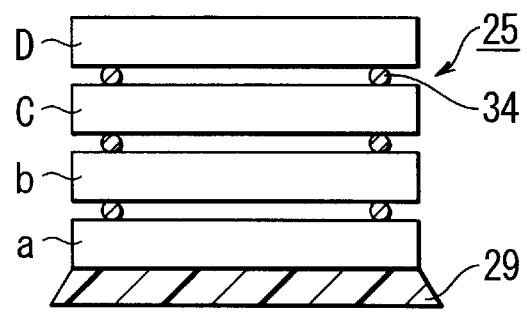
FIG. 9B is a sectional view of a detailed structure of a semiconductor element portion of a semiconductor device shown in FIG. 9A.

FIG. 9A is a sectional view of a semiconductor device manufactured by a manufacturing method according to a fifth embodiment of the present invention, and FIG. 9B is a sectional view of a detailed structure of a semiconductor element portion of a semiconductor device shown in FIG. 9A.

The semiconductor device of this embodiment is comprised of a plurality of wiring printed substrates 50 each having the semiconductor element 25 mounted thereon and a plurality of conductive-via provided insulating substrates 40 including the chip cavity 32 which is a space for accommodating the semiconductor element 25 loaded on the wiring printed substrate 50 so as to realize the superposed structure for the semiconductor elements (FIG. 9A). In the superposed structure of this embodiment, four pieces of the semiconductor elements 25 are superposed. This superposed structure is sandwiched between the upper conductive-via provided insulating substrate 40*a* in which the chip cavity is not formed and the lower conductive-via provided insulating substrate 40*b* in which the chip cavity is not formed. Consequently, the semiconductor elements 25 are tightly sealed thereby improving the reliability of the package structure.

In this superposed structure, the semiconductor element 25 is comprised of silicon chips 25*a*, 25*b*, 25*c*, 25*d* and the silicon chips 25*a*, 25*b*, 25*c*, 25*d* are superposed successively through a bump 34 which is a contact electrode (FIG. 9B).

In this embodiment, the superposed structure can be formed in more layers than the semiconductor device of the first to fourth embodiments and the superposed package can be formed thinner.

According to the present invention, with the above-described structure, the semiconductor device comprised of such thinner superposed packages can be obtained. Further, this superposed structure is sandwiched between the upper conductive-via provided insulating substrate in which the chip cavity is not formed and the lower conductive-via provided insulating substrate in which the chip cavity is not formed. Consequently, the semiconductor elements are sealed completely thereby improving the reliability of the package structure. The semiconductor element is accommodated in the chip cavity formed in the conductive-via provided insulating substrate of each superposed substrate. Because the size of the chip cavity is smaller than that of the semiconductor element, when the semiconductor element is accommodated in the chip cavity, there is formed a space between the semiconductor element and an inner wall of the chip cavity. A flexible adhesive agent such as elastomer, for example silicone resin, is filled in this space. By filling such an adhesive agent, airproof is increased so that moisture resistance of the semiconductor element is improved. Furthermore, since the adhesive agent is flexible, then stress can be absorbed. Therefore, even if the semiconductor device is a little bent and thus the semiconductor element is elongated, the flexible adhesive agent absorbs the elongation of the semiconductor element. That is, even if an external force is applied to the semiconductor device, a generated stress can be absorbed by the flexible adhesive agent. The flexible adhesive agent need not necessarily be provided, and the space may leave as it is. Even the space can absorb the elongation of the semiconductor element. Further, by superposing plurality of the wiring printed substrates each containing the semiconductor element and the conductive-via provided insulating substrates and cutting that superposed structure, the superposed packages can be manufactured with fewer manufacturing processes than a conventional manufacturing process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising a superposed structure formed by superposing a plurality of superposed substrates each including a wiring printed substrate loaded with a semiconductor element and an inner conductive-via provided insulating substrate, wherein said wiring printed substrate has a plurality of contact electrodes formed in a plurality of via holes formed in said wiring printed substrate in such a manner that said contact electrodes are buried in said via holes, and has a plurality of wiring conductors electrically connected to said contact electrodes, said semiconductor element loaded on said wiring printed substrate is electrically connected to said wiring conductors provided on said wiring printed substrate, said conductive-via provided insulating substrate has a chip cavity larger than the semiconductor element size for accommodating the semiconductor element loaded on said wiring printed substrate and a plurality of contact electrodes formed in a plurality of via holes formed in said conductive-via provided insulating substrate in such a manner that said contact holes are buried in the via holes, and said conductive-via provided insulating substrate and said wiring printed substrate are superposed in such a manner that said contact electrodes in said conductive-via provided insulating substrate and said contact electrodes in said wiring printed substrate are electrically connected to each other and in such a manner that said semiconductor element loaded on said wiring printed substrate is accommodated in said chip cavity in said conductive-via provided insulating substrate to constitute a superposed substrate.

2. A semiconductor device according to claim 1, wherein said semiconductor element is substantially 30 to 200 μm in thickness.

3. A semiconductor device according to claim 1, wherein a space for absorbing a stress is formed between said chip cavity of the inner conductive-via provided insulating substrate of said superposed substrate and said semiconductor element accommodated in the chip cavity.

4. A semiconductor device according to claim 3, wherein said space is filled with flexible adhesive agent.

5. A semiconductor device according to claim 1, further comprising a lower, outer conductive-via provided insulating substrate which is superposed on the wiring printed substrate of a lowermost superposed substrate, said outer conductive-via provided insulating substrate having a plurality of contact electrodes formed in a plurality of via holes formed in said outer conductive-via provided insulating substrate in such a manner that said contact electrodes are buried in the via holes, an upper surface of said lower conductive-via provided insulating substrate being in contact with the wiring printed substrate of said lowermost superposed substrate in such a manner that the plurality of contact electrodes of said lower conductive-via provided insulating substrate are electrically connected to the plurality of contact electrodes in the wiring printed substrate of said lowermost superposed substrate and a lower surface of said lower conductive-via provided insulating substrate having a plurality of external terminals connected to the plurality of contact electrodes formed in the plurality of the holes in said lower conductive-via provided insulating substrate.

6. A semiconductor device according to claim 5, wherein a space for absorbing a stress is formed between said chip cavity of the inner conductive-via provided insulating substrate of said superposed substrate and said semiconductor element accommodated in the chip cavity.

7. A semiconductor device according to claim 6, wherein said space is filled with flexible adhesive agent.

8. A semiconductor device comprising a superposed structure formed by superposing a plurality of superposed substrates each including a wiring printed substrate loaded with a semiconductor element and an inner conductive-via provided insulating substrate, and including an upper, outer conductive-via provided insulating substrate which is superposed on the inner conductive-via provided insulating substrate of an uppermost superposed substrate and has a plurality of contact electrodes formed in a plurality of via holes formed in said upper conductive-via provided insulating substrate in such a manner that said contact electrodes are buried in the via holes, wherein said wiring printed substrate has a plurality of contact electrodes formed in a plurality of via holes formed in said wiring printed substrate in such a manner that said contact electrodes are buried in said via holes and a plurality of wiring conductors electrically connected to said contact electrodes of said wiring printed substrate, said semiconductor element loaded on said wiring printed substrate is electrically connected to said wiring conductors provided on said wiring printed substrate, said inner conductive-via provided insulating substrate has a chip cavity larger than the semiconductor element size for accommodating the semiconductor element loaded on said wiring printed substrate and a plurality of contact electrodes formed in a plurality of via holes formed in said inner conductive-via provided insulating substrate in such a manner said that contact electrodes are buried in the via holes, and said inner conductive-via provided insulating substrate and said wiring printed substrate are superposed in such a manner that said contact electrodes in said conductive-via provided insulating substrate and contact electrodes in said wiring printed substrate are electrically connected to each other and in such a manner that said semiconductor element loaded on said wiring printed substrate is accommodated in said chip cavity in said conductive-via provided insulating substrate to constitute a superposed substrate.

9. A semiconductor device according to claim 8, wherein said semiconductor element is substantially 30 to 200 μm in thickness.

10. A semiconductor device according to claim 8, wherein a space for absorbing a stress is formed between said chip cavity of the inner conductive-via provided insulating substrate of said superposed substrate and said semiconductor element accommodated in the chip cavity.

11. A semiconductor device according to claim 10, wherein said space is filled with flexible adhesive agent.

12. A semiconductor device according to claim 8, further comprising a lower, outer conductive-via provided insulating substrate which is superposed on the wiring printed substrate of a lowermost superposed substrate, said outer conductive-via provided insulating substrate having a plurality of contact electrodes formed in a plurality of via holes formed in said outer conductive-via provided insulating substrate in such a manner that said contact electrodes are buried in the via holes, an upper surface of said lower conductive-via provided insulating substrate being in contact with the wiring printed substrate of said lowermost superposed substrate in such a manner that the plurality of contact electrodes of said lower conductive-via provided insulating substrate are electrically connected to the plurality of contact electrodes in the wiring printed substrate of said lowermost superposed substrate and a lower surface of said lower conductive-via provided insulating substrate having a plurality of external terminals connected to the plurality of contact electrodes formed in the plurality of the holes in said lower conductive-via provided insulating substrate.

13. A semiconductor device according to claim 12, wherein a space for absorbing a stress is formed between said chip cavity of the inner conductive-via provided insulating substrate of said superposed substrate and said semiconductor element accommodated in the chip cavity.

14. A semiconductor device according to claim 13, wherein said space is filled with flexible adhesive agent.

* * * * *

UNITED STATES PATENT AND TRADEMARK OFFICE
CERTIFICATE OF CORRECTION

PATENT NO. : 6,469,374 B1
DATED : October 22, 2002
INVENTOR(S) : Imoto

It is certified that error appears in the above-identified patent and that said Letters Patent is hereby corrected as shown below:

Title page,
Item [57], ABSTRACT,
Line 2, change "an superposed" to -- a superposed --.

Column 18,
Line 15, change "said that" to -- that said --.

Signed and Sealed this

Sixth Day of May, 2003

JAMES E. ROGAN
*Director of the United States Patent and Trademark Office*